United States Patent
Yang et al.

(10) Patent No.: US 12,525,531 B2
(45) Date of Patent: Jan. 13, 2026

(54) PROTECTION LINER ON INTERCONNECT WIRE TO ENLARGE PROCESSING WINDOW FOR OVERLYING INTERCONNECT VIA

(71) Applicant: Taiwan Semiconductor Manufacturing Company, Ltd., Hsin-Chu (TW)

(72) Inventors: Shin-Yi Yang, New Taipei (TW); Hsin-Yen Huang, New Taipei (TW); Ming-Han Lee, Taipei (TW); Shau-Lin Shue, Hsinchu (TW); Yu-Chen Chan, Taichung (TW); Meng-Pei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/407,517

(22) Filed: Jan. 9, 2024

(65) Prior Publication Data
US 2024/0145381 A1 May 2, 2024

Related U.S. Application Data

(63) Continuation of application No. 17/718,461, filed on Apr. 12, 2022, now Pat. No. 11,908,794, which is a
(Continued)

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/76841* (2013.01); *H01L 21/76877* (2013.01); *H01L 23/53204* (2013.01)

(58) Field of Classification Search
CPC .......... H01L 23/5226; H01L 21/76877; H01L 23/53204; H01L 21/76841; H01L 21/76802
See application file for complete search history.

(56) References Cited

U.S. PATENT DOCUMENTS 8,647,978 B1  2/2014  Ott et al.
9,293,412 B2  3/2016  Bao et al.
(Continued)

OTHER PUBLICATIONS

Bhaviripudi et al. "Role of Kinetic Factors in Chemical Vapor Deposition Synthesis of Uniform Large Area Graphene Using Copper Catalyst." Nano Lett. Oct. 2010, 4128-4133, published on Sep. 2, 2010.
(Continued)

*Primary Examiner* — Karen Kusumakar
(74) *Attorney, Agent, or Firm* — Eschweiler & Potashnik, LLC

(57) ABSTRACT

In some embodiments, the present disclosure relates an integrated chip including a substrate. A conductive interconnect feature is arranged over the substrate. The conductive interconnect feature has a base feature portion with a base feature width and an upper feature portion with an upper feature width. The upper feature width is narrower than the base feature width such that the conductive interconnect feature has tapered outer feature sidewalls. An interconnect via is arranged over the conductive interconnect feature. The interconnect via has a base via portion with a base via width and an upper via portion with an upper via width. The upper
(Continued)

via width is wider than the base via width such that the interconnect via has tapered outer via sidewalls.

20 Claims, 9 Drawing Sheets

Related U.S. Application Data continuation of application No. 16/908,942, filed on Jun. 23, 2020, now Pat. No. 11,309,241.

(56) References Cited

U.S. PATENT DOCUMENTS

| | | | | |
|---|---|---|---|---|
| 9,553,017 | B2* | 1/2017 | Zhang | H01L 21/30625 |
| 10,062,644 | B2 | 8/2018 | Howard et al. | |
| 10,325,807 | B2 | 6/2019 | Samra et al. | |
| 10,374,040 | B1* | 8/2019 | Chanemougame | H10D 84/0186 |
| 11,171,044 | B1* | 11/2021 | Xie | H01L 21/76802 |
| 2018/0025974 | A1* | 1/2018 | Basker | H01L 21/76837 257/534 |
| 2020/0075458 | A1* | 3/2020 | Lee | H01L 23/5226 |
| 2020/0350252 | A1* | 11/2020 | Shin | H01L 21/76843 |
| 2021/0082805 | A1 | 3/2021 | Haran et al. | |

OTHER PUBLICATIONS

Kim et al. "Out-of-Plane Growth of CNTs on Graphene for Supercapacitor Applications." Nanotechnology 23 (2012) 015301 (7pp), published on Dec. 8, 2011.
Redwing, Ronald. "Hexagonal Close Packed Crystal Structure (HCP) MATSE 81: Materials In Today's World." Department of Material Sciences and Engineering, College of Earth and Mineral Sciences, The Pennsylvania State University, published in 2018.
Wikipedia.org "Refractory Metals." Published on Mar. 10, 2020.
Non-Final Office Action dated Sep. 1, 2021 for U.S. Appl. No. 16/908,942.
Notice of Allowance dated Dec. 10, 2021 for U.S. Appl. No. 16/908,942.
Non-Final Office Action dated Jul. 19, 2023 for U.S. Appl. No. 17/718,461.
Notice of Allowance dated Oct. 16, 2023 for U.S. Appl. No. 17/718,461.

* cited by examiner

PROTECTION LINER ON INTERCONNECT WIRE TO ENLARGE PROCESSING WINDOW FOR OVERLYING INTERCONNECT VIA

REFERENCE TO RELATED APPLICATIONS

This application is a Continuation of U.S. application Ser. No. 17/718,461, filed on Apr. 12, 2022, which is a Continuation of U.S. application Ser. No. 16/908,942, filed on Jun. 23, 2020 (now U.S. Pat. No. 11,309,241, issued on Apr. 19, 2022). The contents of the above-referenced Patent Applications are hereby incorporated by reference in their entirety.

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photo-lithography, mask alignment, isolation and device performance among other factors. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
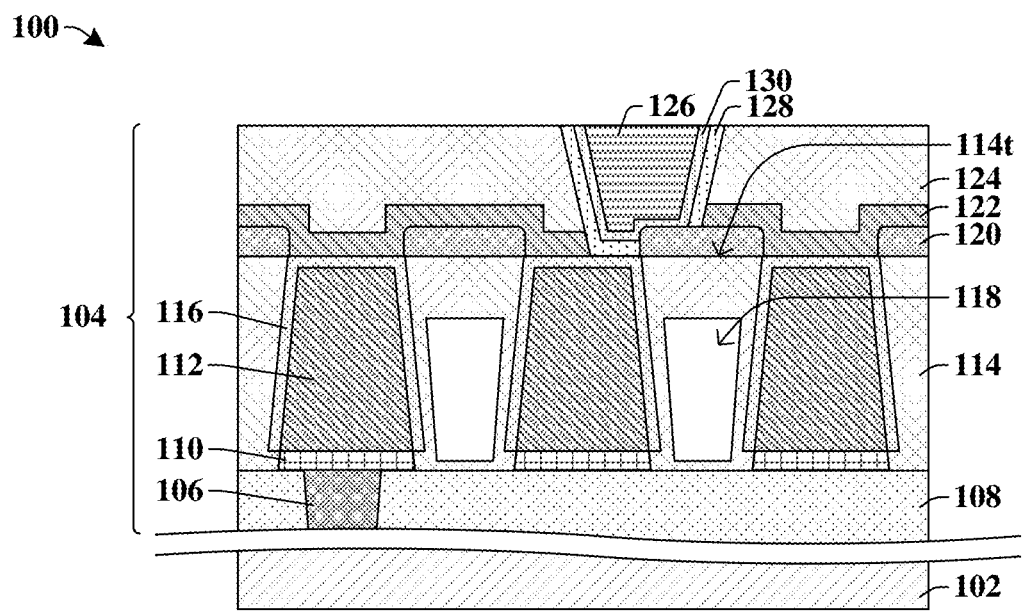
FIG. 1 illustrates a cross-sectional view of some embodiments of an integrated chip having an interconnect wire covered by a protection liner and having an overlying interconnect via that does not extend below the protection liner.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, inductors, capacitors, etc.) and/or memory devices disposed over and/or within a semiconductor substrate. An interconnect structure may be disposed over the semiconductor substrate and coupled to the semiconductor devices. The interconnect structure may include conductive interconnect layers having interconnect wires and interconnect vias within an interconnect dielectric structure. The interconnect wires and/or interconnect vias provide electrical pathways between different semiconductor devices disposed within and/or over the semiconductor substrate. As the size of integrated chips are reduced, air-spacer structures may be formed within the interconnect dielectric structure and between adjacent conductive features to lower a k-value of the interconnect dielectric structure in order to reduce capacitance between the two adjacent conductive features.

Some embodiments of an interconnect structure include interconnect wires coupled to an underlying semiconductor device, and a first interconnect via is arranged over and coupled to one of the interconnect wires. The interconnect wires may be formed by forming patterning a first conductive layer arranged over a semiconductor substrate. Then, a liner layer may be formed continuously over the first interconnect layers, and a first interconnect dielectric layer is formed laterally between the interconnect wires. In some embodiments, air spacer structures are formed within the first interconnect dielectric layer and between the interconnect wires. One or more etch stop layers may be formed over the first interconnect dielectric layer, and a second interconnect dielectric layer is formed over the one or more etch stop layers. A cavity may be formed within the second interconnect dielectric layer, the one or more etch stop layers, and/or the liner layer to expose a top surface of one of the interconnect wires. Then, a conductive material may be formed within the cavity to form an interconnect via structure coupled to the one of the interconnect wires.

However, as the size of the integrated chips decreases, spacing between the interconnect wires is smaller, and forming the cavity that is centered over the one of the interconnect wires becomes more difficult due to processing limitations. In some cases, if the cavity is formed partially over the one of the interconnect wires and partially over one of the air spacer structures, the cavity may also extend through the first interconnect dielectric layer to open the one of the air spacer structures. In such embodiments, the conductive material may fill the air spacer, which may create capacitance between the interconnect via and the interconnect wires.

Various embodiments of the present disclosure relate to the formation of a protection liner on outer surfaces of the interconnect wires. In some embodiments, the protection liner may comprise graphene, which is selectively formed the interconnect wires. Further, in some embodiments, after the formation of the first interconnect dielectric layer around the interconnect wires, a first etch stop layer is formed over the first interconnect dielectric layer. Although top surfaces of the protection liner are exposed during the formation of the first etch stop layer, the first etch stop layer comprises a material is unable to be formed on surfaces comprising graphene. Thus, the first etch stop layer is selectively deposited on the first interconnect dielectric layer and not the protection liner. Then, in some embodiments, a second interconnect dielectric layer is formed over the first interconnect dielectric layer, and a cavity is formed in the second interconnect dielectric layer using a removal process. In some embodiments, an etchant is used during the removal process, and the protection liner and the first etch stop layer are substantially resistant to removal by the etchant. Thus, the cavity does not extend into the first interconnect dielectric layer and disrupt any air spacer structures or other isolation structures within the first dielectric layer. In some embodiments, the cavity is then filled with a conductive material to form an interconnect via over and coupled to the one of the interconnect wires.

Therefore, the protection liner comprising for example, graphene, increases the process window for formation of the interconnect via by preventing removal of the first interconnect dielectric layer during formation of the cavity the cavity is misaligned with the one of the interconnect wires. Further, the graphene of the protection liner may provide other advantages, such as, for example, reducing surface electron scattering of the interconnect wires and/or maintaining resistivity of the interconnect wires even when the dimensions of the interconnect wires are reduced, thereby increasing reliability and efficiency of the integrated chip.

FIG. 1 illustrates a cross-sectional view 100 of some embodiments of an integrated chip comprising an interconnect via arranged over an interconnect wire, wherein a protection liner is between the interconnect wire and the interconnect via.

The integrated chip of FIG. 1 includes an interconnect structure 104 arranged over a substrate 102. In some embodiments, the interconnect structure 104 comprises a lower interconnect via 106, interconnect wires 112 arranged over the lower interconnect via 106, and an interconnect via 126 arranged over the interconnect wires 112. In some embodiments, the interconnect structure 104 may further comprise more interconnect wires and vias arranged above and below the lower interconnect via 106 and the interconnect via 126. Further, in some embodiments, the interconnect structure 104 may be coupled to one or more semiconductor devices (e.g., transistors, inductors, capacitors, etc.) and/or memory devices disposed over and/or within the substrate 102. Thus, the interconnect wires 112, lower interconnect via 106, and the interconnect via 126 may be electrically coupled to one another and to any underlying or overlying devices (not shown) to provide a conductive pathway for signals (e.g., voltage, current) traveling through the integrated chip.

In some embodiments, the lower interconnect via 106 is embedded within a lower interconnect dielectric layer 108. Further, in some embodiments, a first barrier layer 110 is arranged between the lower interconnect dielectric layer 108 and the interconnect wires 112. In some embodiments, the first barrier layer 110 may act as an interfacial layer between the lower interconnect via 106 and/or the lower interconnect dielectric layer 108. In some embodiments, the interconnect wires 112 are arranged within a first interconnect dielectric layer 114 that is arranged over the lower interconnect dielectric layer 108. In some embodiments, air spacer structures 118 are embedded within the first interconnect dielectric layer 114 and are arranged laterally between the interconnect wires 112. The air spacer structures 118 may reduce capacitance between the interconnect wires 112. In other embodiments, isolation structures other than or in addition to the air spacer structures 118 may be arranged within the first interconnect dielectric layer 114 to prevent cross-talk between the interconnect wires 112.

In some embodiments, a protection liner 116 covers outer sidewalls and top surfaces of each interconnect wire 112. In such embodiments, the protection liner 116 may comprise a material that reduces electron scattering of the first interconnect wires and also mitigates a change in resistivity as spacing between the interconnect wires 112 decreases. In such embodiments, the protection liner 116 may comprise graphene. In other embodiments, the protection liner 116 may comprise some other two dimensional material. In some embodiments, a two dimensional material is a material that has an atomic structure that may be formed on a two-dimensional plane. For example, in some embodiments, other suitable two-dimensional materials for the protection liner 116 may include hexagonal structures of boron nitride, molybdenum sulfide, tantalum sulfide, tungsten sulfide, tungsten selenide, or the like. During processing steps, the protection liner 116 may be selectively formed on the interconnect wires 112, and not on the lower interconnect dielectric layer 108, thereby reducing the need for patterning and/or removal processes when forming the protection liner 116. Thus, the protection liner 116 may comprise a material that provides such aforementioned selectivity, wherein the protection liner 116 may be selectively formed on the interconnect wires 112 and not on the lower interconnect dielectric layer 108.

In some embodiments, the interconnect structure 104 further comprises a first etch stop layer 120 arranged over the first interconnect dielectric layer 114. In some embodiments, the first etch stop layer 120 is not arranged over the protection liner 116. In such embodiments, the first etch stop layer 120 comprises a material and a corresponding deposition process that prevents the first etch stop layer 120 from being formed on the protection liner 116. Similarly, the protection liner 116 comprises a material that does not allow the first etch stop layer 120 to be formed on it, in some embodiments. For example, in some embodiments, wherein the protection liner 116 comprises graphene, the first etch stop layer 120 may comprise titanium nitride, titanium oxide, aluminum nitride, aluminum oxide, or some other metal-oxide or metal-nitride material. In some embodiments, a second etch stop layer 122 is arranged directly over the first etch stop layer 120 and the protection liner 116. In such embodiments, the second etch stop layer 122 comprises a different material than the first etch stop layer 120, and thus, may be formed directly on the protection liner 116. For example, in some embodiments, the second etch stop layer 122 may comprise silicon dioxide, silicon carbide, or some other suitable material.

In some embodiments, a second interconnect dielectric layer 124 is arranged over the second etch stop layer 122, and an interconnect via 126 is arranged over one of the interconnect wires 112. In some embodiments, the interconnect via 126 is arranged directly over the one of the interconnect wires 112 as well as directly over the first interconnect dielectric layer 114 and/or one of the air spacer structures 118. Further, in some embodiments, a second barrier layer 128 is arranged directly between the interconnect via 126 and the second interconnect dielectric layer 124. In some embodiments, a third barrier layer 130 is arranged directly on the interconnect via 126 and separates the second barrier layer 128 from the interconnect via 126.

During some embodiments of forming the interconnect via 126, the second interconnect dielectric layer 124 is formed over the second etch stop layer 122, and then, a cavity may be formed within the second interconnect dielectric layer 124 and the second etch stop layer 122 to expose the protection liner 116. In such embodiments, a removal process comprising and etchant may be used to form the cavity. In some embodiments, the protection liner 116 and the first etch stop layer 120 may be substantially resistant to removal by the etchant. This way, if portions of the cavity are arranged directly over the first interconnect dielectric layer 114, the first etch stop layer 120 and the protection liner 116 prevent the cavity from extending into the first interconnect dielectric layer 114 and altering the first interconnect dielectric layer 114, the air spacer structures 118, and/or other features within the first interconnect dielectric layer 114. Therefore, the interconnect via 126, the second barrier layer 128, and/or the third barrier layer 130 do not extend below a topmost surface 114t of the first interconnect dielectric layer 114, and thus, the mitigation of cross-talk between the interconnect wires 112 provided by the protection liner 116, the air spacer structures 118, and the first interconnect dielectric layer 114 is maintained.

Figure 2:
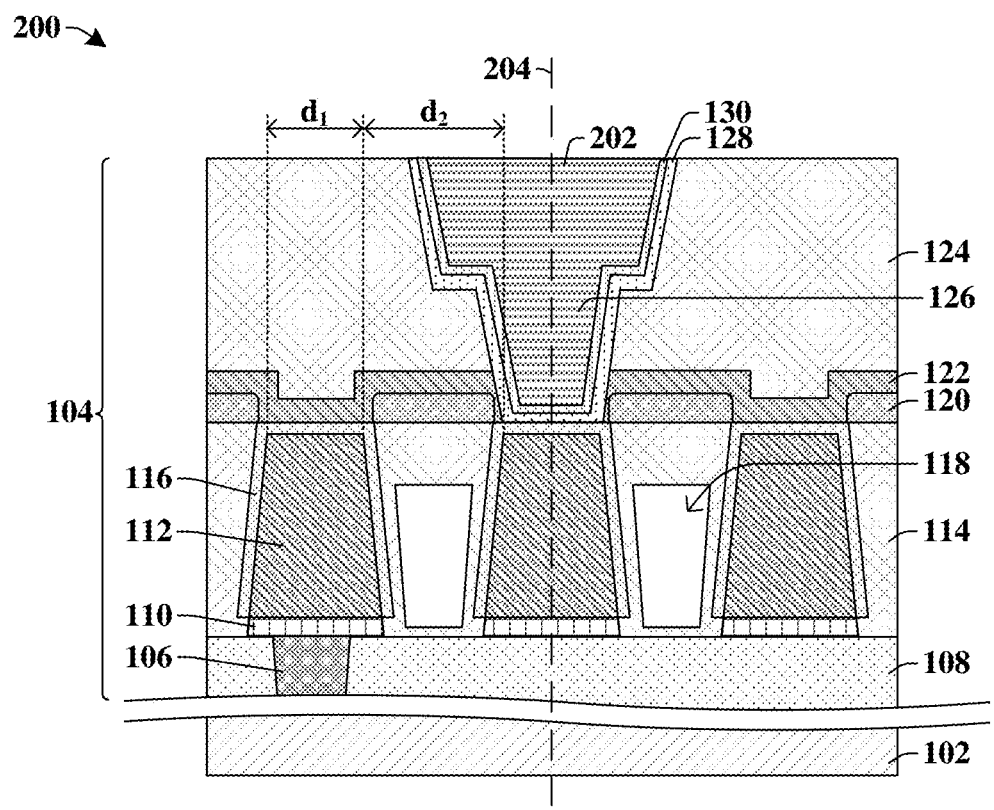
FIGS. 2 and 3 illustrate cross-sectional views of some alternative embodiments of an integrated chip having an interconnect wire covered by a protection liner and having an overlying interconnect via that does not extend below the protection liner.

FIG. 2 illustrates a cross-sectional view 200 of some other embodiments of an integrated chip comprising a protection layer arranged over an interconnect wire, wherein an overlying via is substantially centered over the interconnect wire.

In some embodiments, the interconnect structure 104 further comprises an upper interconnect wire 202 that is arranged over and coupled to the interconnect via 126. In some embodiments, the upper interconnect wire 202 and the interconnect via 126 may have been formed using a dual damascene process. In such embodiments, the second and third barrier layers 128 may continuously surround both the interconnect via 126 and the upper interconnect wire 202. In some embodiments, the second and/or third barrier layers 128, 130 are arranged directly between the interconnect via 126 and the protection liner 116. Further, in some embodiments, the interconnect via 126 and the upper interconnect wire 202 may comprise a same material, such as, for example, copper, aluminum, tungsten, or some other suitable conductive material. In some embodiments, the interconnect wires 112 may comprise, for example, copper, nickel cobalt, ruthenium, iridium, aluminum, platinum, palladium, gold, silver, osmium, tungsten, or some other suitable conductive material or alloy. In some embodiments, the interconnect wires 112 may comprise a refractory metal having a melting point greater than 2,000 degrees Celsius, such as, for example tungsten, molybdenum, tantalum, ruthenium, or the like.

In some embodiments, the interconnect wires 112 each have a width equal to a first distance $d_1$. In some embodiments, the first distance $d_1$ may decrease as the width of the interconnect wires 112 are measured further away from the substrate 102. In such embodiments, the variable first distance $d_1$ of the interconnect wires 112 is a result of the processing steps (e.g., vertical dry etching) used to form the interconnect wires 112. Nevertheless, in some embodiments, the first distance $d_1$ may be in a range of between, for example, approximately 1 nanometer and approximately 20 nanometers. Further, in some embodiments, nearest neighbors of the interconnect wires 112 are spaced apart from one another by a second distance $d_2$. In some embodiments, the second distance $d_2$ may increase as it is measured further away from the substrate 102. Nevertheless, in some embodiments, the second distance $d_2$ is in a range of between, for example, approximately 1 nanometer and approximately 20 nanometers. It will be appreciated that other values for the first distance $d_1$ and the second distance $d_2$ are also within the scope of the disclosure. With such small first and second distances $d_1$, $d_2$, maintaining isolation between the interconnect wires 112 to reduce cross-talk is important to provide a reliable device.

Further, in some embodiments, a center of the interconnect wire 112 arranged directly below the interconnect via 126 may be arranged on a first line 204. In such embodiments, the first line 204 is perpendicular to a top surface of the substrate 102 and also intersects the center of the interconnect wire 112. In some embodiments, the center of the interconnect wire 112 is determined to be a midpoint of a width of the interconnect wire 112. In some embodiments, a center of the interconnect via 126 is similarly determined to be a midpoint of a width of the interconnect via 126. In some embodiments, as illustrated in the cross-sectional view 200 of FIG. 2, the first line 204 also intersects the center of the interconnect via 126. In such embodiments, the interconnect via 126 and the underlying interconnect wire 112 may be classified as being "aligned" or "centered" with one another. Such embodiments, wherein the interconnect via 126 and the underlying interconnect wire 112 are aligned, are ideal to increase an area of contact between the interconnect via 126 and the underlying interconnect wire 112. However, in some embodiments, wherein the dimensions of the interconnect wire 112 and the interconnect via 126 are so small (e.g., less than 20 nanometers), alignment between the interconnect via 126 and the underlying interconnect wire 112 is rare due to processing limitations (e.g., photolithography precision, etching precision, etc.). Thus, the protection liner 116 and first etch stop layer 120 are still included in case of instances where the interconnect via 126 and the underlying interconnect wire 112 are misaligned (e.g., FIGS. 1, 2, and 4).

Figure 3:
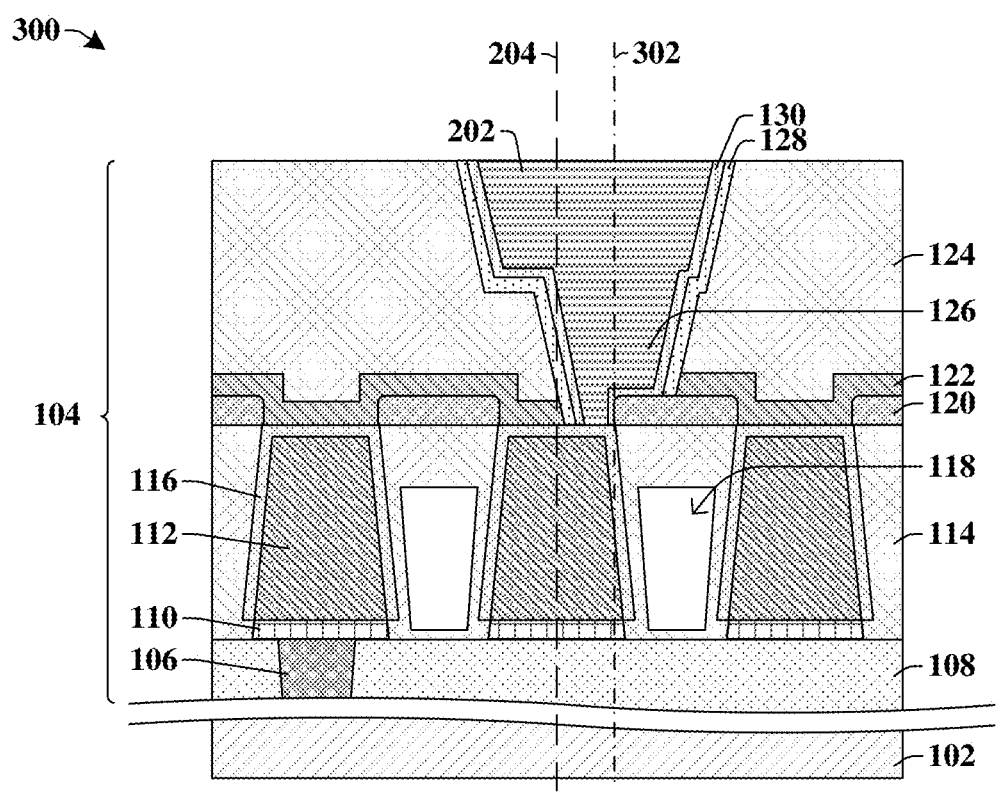

FIG. 3 illustrates a cross-sectional view 300 of some alternative embodiments of FIG. 2.

In some embodiments, the first line 204 intersects the center of the interconnect wire 112 that directly underlies the interconnect via 126. In some embodiments, a second line 302 intersects the center of the interconnect via 126 and is perpendicular to the top surface of the substrate 102. In some embodiments, the first line 204 is parallel to the second line 302, and thus, the center of the interconnect via 126 does not directly overlie the center of the underlying interconnect wire 112. In such embodiments, the interconnect via 126 and the underlying interconnect wire 112 may be classified as being "misaligned" or "not centered" with one another. In such embodiments, as described with respect to the cross-sectional view 100 of FIG. 1, the protection liner 116 and the first etch stop layer 120 aid in protecting the first interconnect dielectric layer 114 and/or the air spacer structures 118 during the formation of the interconnect via 126 when the interconnect via 126 directly overlies the first interconnect dielectric layer 114 and/or when the interconnect via 126 is misaligned with the underlying interconnect wire 112.

Further, in some embodiments, a portion of the interconnect via 126 may directly contact a portion of the protection liner 116. In such embodiments, the second and/or third barrier layers 128, 130 may not be arranged directly over the portion of the protection liner 116. In such embodiments, the second and/or third barrier layers 128, 130 may comprise a material that cannot be formed on the protection liner 116. In other embodiments, the second and/or third barrier layers 128, 130 may be formed directly over the protection liner 116 and then selectively removed from the protection liner 116. In some embodiments, as illustrated in FIG. 3, wherein the portion of the interconnect via 126 directly contacts the portion of the protection liner 116, the contact resistance between the interconnect via 126 and the underlying interconnect wire 112 may be reduced. However, in such embodiments, more specific materials for the second and/or third barrier layers 128, 130 and/or more processing steps may be needed such that the portion of the interconnect via 126 directly contacts the portion of the protection liner 116 as illustrated in FIG. 3 compared to embodiments wherein the second and/or third barrier layers 128, 130 are arranged directly between the interconnect via 126 and the protection liner 116 as illustrated in FIG. 1, for example.

Figure 4:
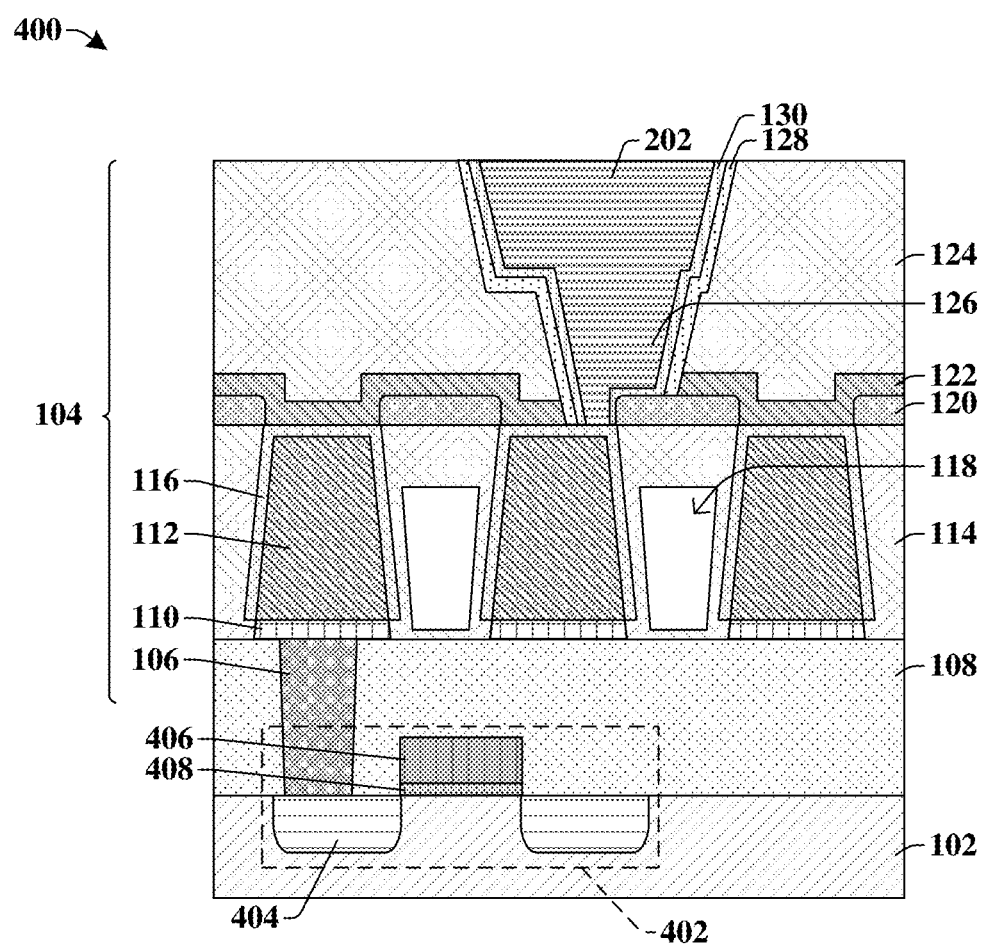
FIG. 4 illustrates a cross-sectional view of some other embodiments of an interconnect wire covered by a protection layer and coupled to an underlying semiconductor device.

FIG. 4 illustrates a cross-sectional view 400 of some embodiments wherein an interconnect structure comprising a protection liner is coupled to an underlying semiconductor device.

In some embodiments, the lower interconnect via 106 is coupled to an underlying semiconductor device 402. In some embodiments, the underlying semiconductor device 402 may comprise, for example, a field effect transistor (FET). In such embodiments, the semiconductor device 402 may comprise source/drain regions 404 within the substrate 102. The source/drain regions 404 may comprise doped portions of the substrate 102. Further, in some embodiments, the semiconductor device 402 may comprise a gate electrode 406 arranged over the substrate 102 and between the source/drain regions 404. In some embodiments, a gate dielectric layer 408 may be arranged directly between the gate electrode 406 and the substrate 102. In some embodiments, the lower interconnect via 106 is coupled to one of the source/drain regions 404 of the semiconductor device 402. In other embodiments, the lower interconnect via 106 may be coupled to the gate electrode 406, for example. Further, in some embodiments, it will be appreciated that the interconnect structure 104 may couple the semiconductor device 402 to some other semiconductor device, memory device, photo device, or some other electronic device. It will be appreciated that other electronic/semiconductor devices other than the FET illustrated as the semiconductor device 402 is also within the scope of this disclosure.

FIGS. 5-15 illustrate cross-sectional views 500-1500 of some embodiments of a method of forming an interconnect via over an interconnect wire using a protection liner on the interconnect wire to increase a processing window for formation of the interconnect via. Although FIGS. 5-15 are described in relation to a method, it will be appreciated that the structures disclosed in FIGS. 5-15 are not limited to such a method, but instead may stand alone as structures independent of the method.

Figure 5:
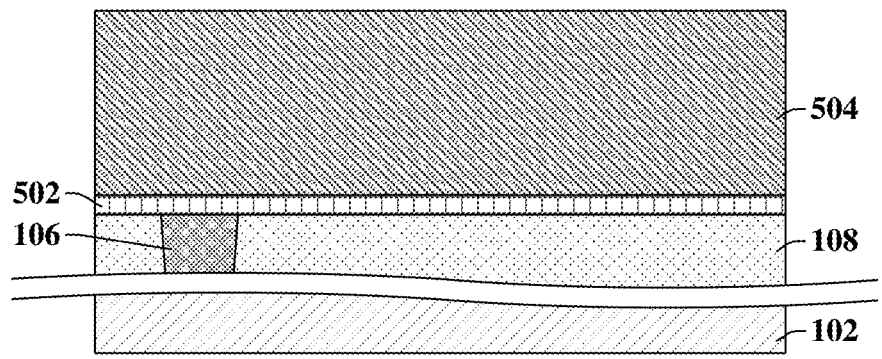
FIGS. 5-15 illustrate cross-sectional views of some embodiments of a method of forming an integrated chip having an interconnect wire covered by a protection liner, wherein the protection liner aids in preventing an overlying interconnect via from being formed below a topmost surface of the interconnect wire.

As shown in cross-sectional view 500 of FIG. 5, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated with. In some embodiments, a lower interconnect dielectric layer 108 is formed over the substrate 102. In some embodiments, various semiconductor devices (e.g., transistors, inductors, capacitors, etc.) and/or memory devices (not shown) may be arranged over and/or within the substrate 102 and beneath the lower interconnect dielectric layer 108. In some embodiments, a lower interconnect via 106 may be formed within the lower interconnect dielectric layer 108 and coupled to one or more of the various semiconductor devices and/or memory devices (not shown).

In some embodiments, the lower interconnect dielectric layer 108 may be formed by way of a deposition process (e.g., physical vapor deposition (PVD), chemical vapor deposition (CVD), plasma-enhanced CVD (PE-CVD), atomic layer deposition (ALD), etc.). Further, in some embodiments, the lower interconnect via 106 may be formed within the interconnect dielectric layer 108 through various steps of patterning (e.g., photolithography/etching), deposition (e.g., PVD, CVD, PE-CVD, ALD, sputtering, etc.), and removal (e.g., wet etching, dry etching, chemical mechanical planarization (CMP), etc.) processes. In some embodiments, the lower interconnect dielectric layer 108 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable low-k (e.g., dielectric constant between about 1 and about 3.8) dielectric material. In some embodiments, the lower interconnect via 106 may comprise, for example, aluminum, titanium, tungsten, copper, or some other suitable conductive material.

In some embodiments, a first continuous barrier layer 502 is formed over the lower interconnect dielectric layer 108. In some embodiments, the first continuous barrier layer 502 comprises, for example, tantalum nitride, titanium nitride, titanium, tantalum, or some other suitable material or metal-nitride. Further, in some embodiments, a conductive layer 504 is formed over the first continuous barrier layer 502. In some embodiments, the conductive layer 504 may comprise, for example, copper, nickel cobalt, ruthenium, iridium, aluminum, platinum, palladium, gold, silver, osmium, tungsten, or some other suitable conductive material or alloy. In some embodiments, the conductive layer 504 may each be formed by way of, for example, a deposition process (e.g., PVD, CVD, PE-CVD, ALD, electroless deposition (ELD), electrochemical plating (ECP), sputtering, etc.). In some embodiments, the formation of the conductive layer 504 is performed in a chamber having a temperature in a range of between, for example, approximately 100 degrees Celsius and approximately 700 degrees Celsius.

Figure 6:
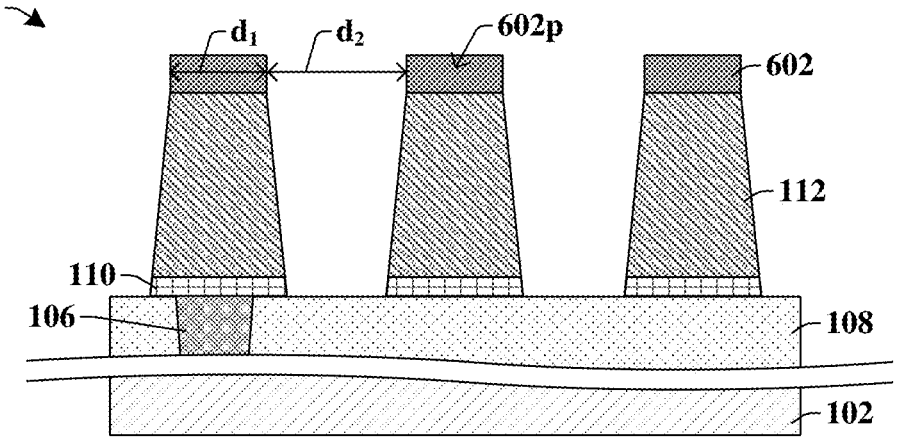

As shown in cross-sectional view 600 of FIG. 6, a patterning and removal process may be performed on the conductive layer (504 of FIG. 5) and the first continuous barrier layer (502 of FIG. 5) according to a first masking structure 602 to form interconnect wires 112 arranged over first barrier layers 110 on the lower interconnect dielectric layer 108. In some embodiments, the first masking structure 602 may be formed over the conductive layer (504 of FIG. 5) by using photolithography and removal (e.g., etching) processes. In some embodiments, the first masking structure 602 comprises a photoresist or hard mask material. In some embodiments, the first masking structure 602 comprises three portions 602p, wherein each portion 602p has a width equal to a first distance $d_1$, and wherein each portion 602p is spaced apart from a nearest neighboring portion 602p by a second distance $d_2$. In other embodiments, the first masking structure 602 may comprise more or less than three portions 602p spaced apart from one another. In some embodiments, the first distance $d_1$ may be in a range of between, for example, approximately 1 nanometer and approximately 20 nanometers. In some embodiments, the second distance $d_2$ is in a range of between, for example, approximately 1 nanometer and approximately 20 nanometers. It will be appreciated that other values for the first distance $d_1$ and the second distance $d_2$ are also within the scope of the disclosure.

After the formation of the first masking structure 602, a removal process may be performed to remove portions of the conductive layer (504 of FIG. 5) and the first continuous barrier layer (502 of FIG. 5) that do not directly underlie the first masking structure 602 to form the interconnect wires 112. In some embodiments, the removal process may be or comprise an etching process (e.g., wet etching, dry etching). In some embodiments, wherein the removal process of FIG. 6 comprises a dry etching process, the interconnect wires 112 may have a substantially trapezoidal shape, wherein upper surfaces of the interconnect wires 112 are narrower than lower surfaces of the interconnect wires 112. In some embodiments, at least one of the interconnect wires 112 is formed directly over and coupled to the lower interconnect via 106. Thus, in some embodiments, one of the portions 602p of the first masking structure 602 is formed directly over the lower interconnect via 106.

Figure 7:
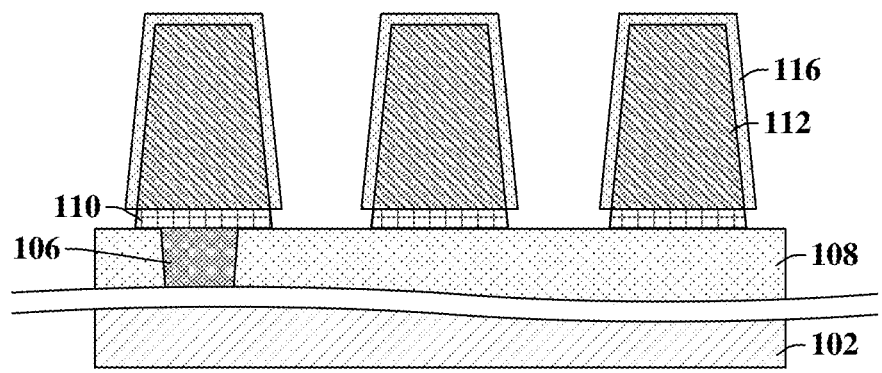

As shown in cross-sectional view 700 of FIG. 7, the first masking structure (602 of FIG. 6) is removed, and a protection liner 116 is formed over outer sidewalls and upper surfaces over of the interconnect wires 112. In some embodiments, the protection liner 116 continuously and completely covers the outer sidewalls and upper surfaces of each interconnect wire 112; however, in some embodiments, the protection liner 116 on a first one of the interconnect wires 112 is not connected to the protection liner 116 on a second one or a third one of the interconnect wires 112. In such embodiments, the protection liner 116 may comprise a material that is selectively deposited on the material of the interconnect wires 112. In such embodiments, the material of the protection liner 116 cannot be deposited on the first barrier layers 110 and/or the lower interconnect dielectric layer 108. Thus, in some embodiments, the protection liner 116 comprises graphene that may be formed by way of, for example, ALD, CVD, plasma-enhanced ALD, PE-CVD, thermal CVD, or some other suitable processes. In other embodiments, the protection liner 116 may comprise some other two dimensional material such as, for example, hexagonal structures of boron nitride, molybdenum sulfide, tantalum sulfide, tungsten sulfide, tungsten selenide, or some other suitable two dimensional material.

In some embodiments, the protection liner 116 may be deposited in a chamber set to a temperature in a range of between, for example, approximately 25 degrees Celsius and approximately 1200 degrees Celsius; set to a pressure in a range of between, for example, approximately 0.1 Torr and approximately 760 Torr; set to a gas flow rate in a range of between, for example, approximately 100 standard cubic centimeters per minute and approximately 10000 cubic centimeters per minute; and set to a plasma power in a range of between, for example, approximately 50 Watts and approximately 1000 Watts. In some embodiments, the graphene of the protection liner 116 is formed using precursors comprising carbon and hydrogen, such as, for example, hydrogen gas and carbon-hydrogen gas (e.g., methane). It will be appreciated that the chamber used to form the protection liner 116 may be set to parameters outside of the aforementioned ranges and other precursors may be used to form the protection liner 116 than carbon and hydrogen. In some embodiments, the protection liner 116 has a thickness in a range of between, for example, approximately 3 angstroms and approximately 30 angstroms. Further, in some embodiments, wherein the protection liner 116 is deposited in a chamber set to a temperature in a range of, for example, between approximately 25 degrees Celsius and approximately 1200 degrees Celsius, the melting point of the interconnect wires 112 is greater than approximately 1200 degrees Celsius.

Because the protection liner 116 may comprise a material (e.g., graphene) that can be selectively deposited on the interconnect wires 112, removal steps of the protection liner 116 may be omitted, thereby increasing manufacturing efficiency and reducing manufacturing costs. Further, in embodiments wherein the protection liner 116 comprises graphene, the graphene of the protection liner 116 reduces electron scattering of the interconnect wires 112, thereby aiding in a low resistivity of the interconnect wires 112 when the interconnect wires 112 are arranged close to one another as dimensions of integrated chips decrease.

Figure 8:
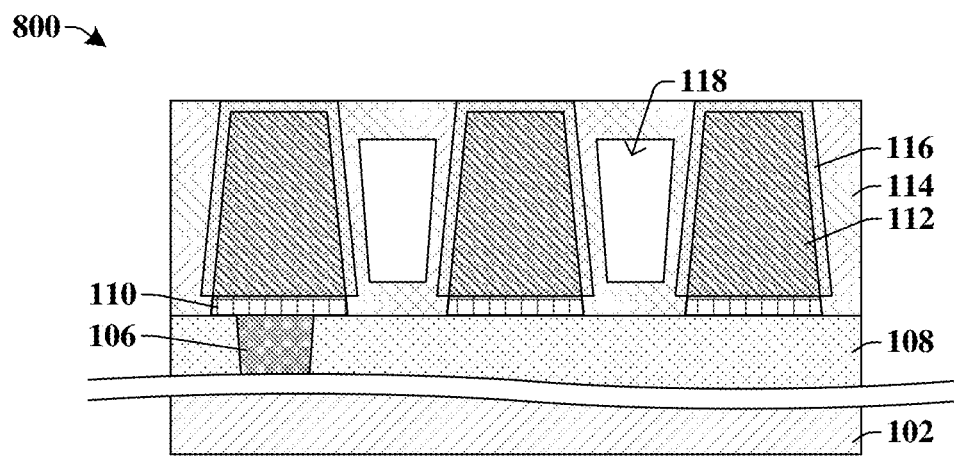

As shown in cross-sectional view 800 of FIG. 8, in some embodiments, a first interconnect dielectric layer 114 is formed over the interconnect wires 112 and the protection liner 116. In some embodiments, the first interconnect dielectric layer 114 is formed by way of deposition (e.g., PVD, CVD, PE-CVD, ALD, etc.) and/or removal (e.g., CMP) processes. Thus, in some embodiments, the first interconnect dielectric layer 114 has an upper surface that is substantially planar with upper surfaces of the protection liner 116. In some embodiments, the formation of the first interconnect dielectric layer 114 is performed in a chamber having a temperature in a range of between, for example, approximately 50 degrees Celsius and approximately 425 degrees Celsius. In some embodiments, the first interconnect dielectric layer 114 comprises a low-k dielectric material, wherein the dielectric constant is in a range of between about 1 and about 3.8, such as, for example, silicon dioxide, silicon oxygen carbon hydride, silicon oxygen carbide, silicon carbide, silicon nitride, or some other suitable low-k dielectric material.

In some embodiments, air spacer structures 118 may be introduced in the first interconnect dielectric layer 114 by choosing a suitable formation process. A suitable processing forming the air spacer structures 118 in the first interconnect dielectric layer 114 may include a non-conformal deposition process such as, for example, PE-CVD. Non-conformal deposition processes create gaps of air in recessed areas such as between adjacent interconnect wires 112 to form the air spacer structures 118. It will be appreciated that other processing methods than PE-CVD to form the air spacer structures 118 within the first interconnect dielectric layer 114 are also within the scope of this disclosure. In some embodiments, the air spacer structures 118 are formed to provide further reduction in capacitance between adjacent interconnect wires 112 to increase device reliability and speed.

Figure 9:
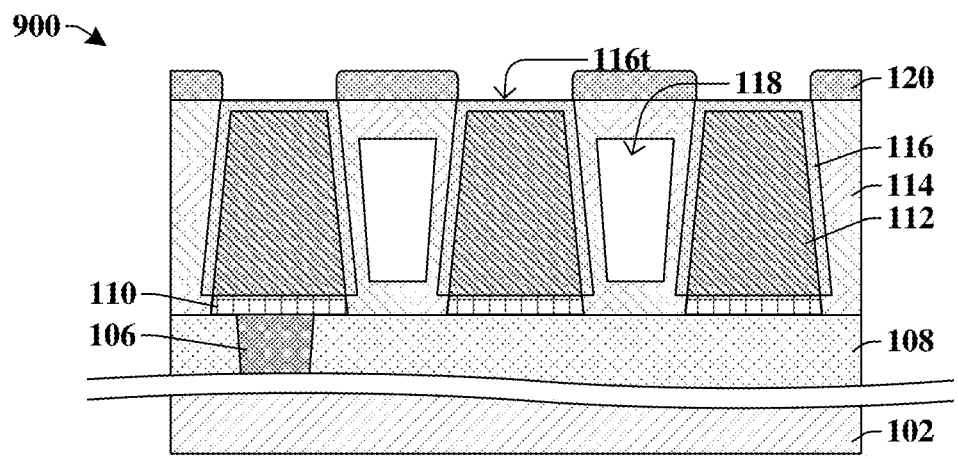

As shown in cross-sectional view 900 of FIG. 9, in some embodiments, a first etch stop layer 120 is formed directly on the first interconnect dielectric layer 114. In some embodiments, the first etch stop layer 120 comprises a material that is unable to be deposited/formed on the material of the protection liner 116. In some embodiments, the material of the first etch stop layer 120 may comprise, for example, titanium nitride, titanium oxide, aluminum nitride, aluminum oxide, or some other suitable metal-nitride or metal-oxide material. In some embodiments, the first etch stop layer 120 may be formed by way of a deposition process such as, for example, PVD, CVD, PE-CVD, ALD, plasma-enhanced ALD, or some other suitable process. In some embodiments, the formation of the first etch stop layer 120 is performed in a chamber having a temperature in a range of between, for example, approximately 50 degrees Celsius and approximately 425 degrees Celsius. Because the first etch stop layer 120 may comprise a material that can be selectively deposited on the first interconnect dielectric layer 114 and not on the protection liner 116, removal steps of the first etch stop layer 120 may be omitted, thereby increasing manufacturing efficiency and reducing manufacturing costs.

Figure 10:
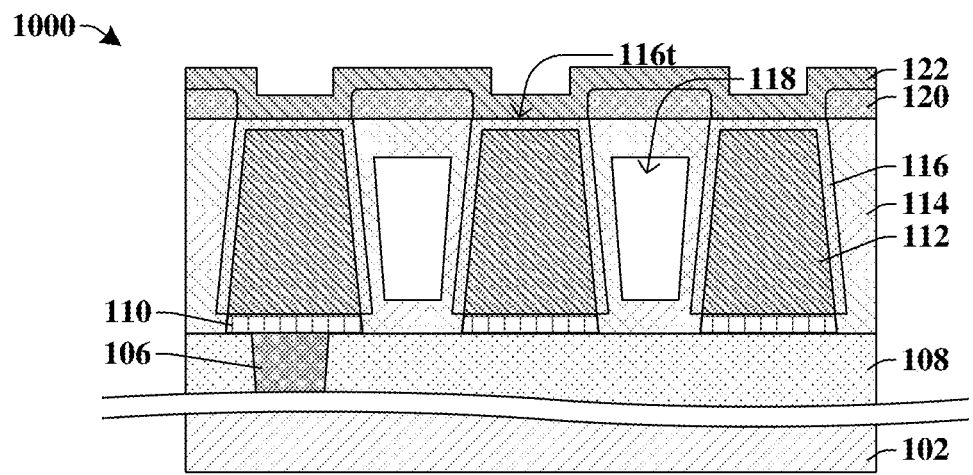

As shown in cross-sectional view 1000 of FIG. 10, in some embodiments, a second etch stop layer 122 is formed over the first etch stop layer 120 and the protection liner 116. Thus, in some embodiments, the second etch stop layer 122 comprises a different material than the first etch stop layer 120, at least because the second etch stop layer 122 may be formed directly on the protection liner 116. Thus, in some embodiments, the second etch stop layer 122 is a continuously connect layer arranged over the protection liner 116 and the first interconnect dielectric layer 114. In some embodiments, the second etch stop layer 122 comprises, for example, silicon dioxide, silicon carbide, silicon nitride, or some other dielectric material. In some embodiments, the second etch stop layer 122 is formed by way of a deposition process (e.g., PVD, CVD, PE-CVD, ALD, etc.).

Figure 11:
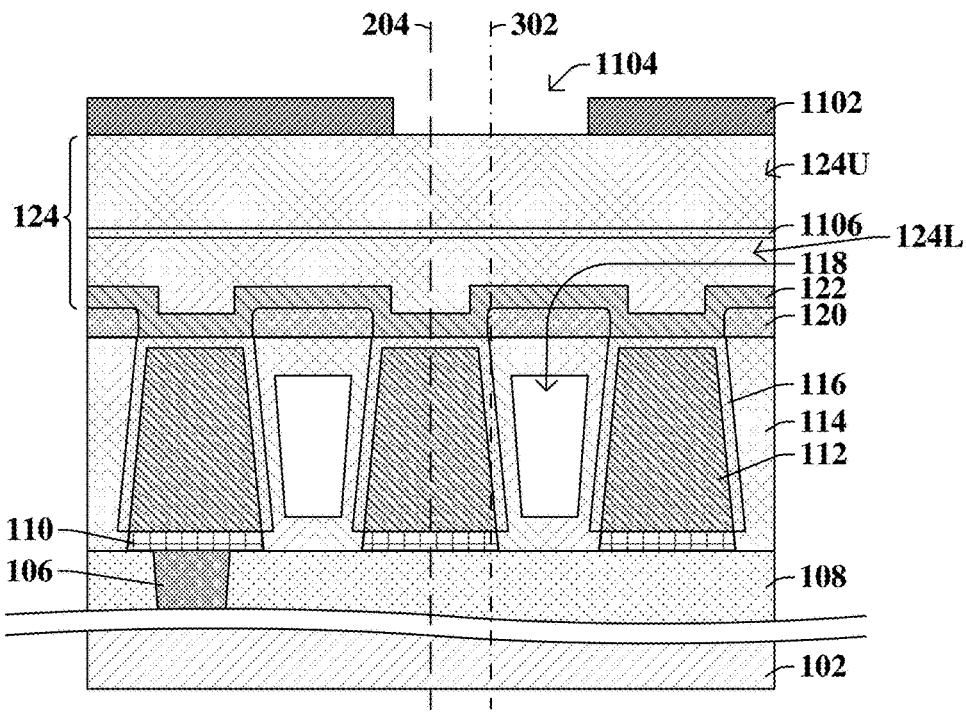

As shown in cross-sectional view 1100 of FIG. 11, in some embodiments, a second interconnect dielectric layer 124 is formed over the second etch stop layer 122, and a second masking structure 1102 is formed over the second interconnect dielectric layer 124. In some embodiments, the second interconnect dielectric layer 124 comprises a low-k dielectric material, wherein the dielectric constant is in a range of between about 1 and about 3.8, such as, for example, silicon dioxide, silicon oxygen carbon hydride, silicon oxygen carbide, silicon carbide, silicon nitride, or some other suitable low-k dielectric material. In some embodiments, the formation of the second interconnect dielectric layer 124 is performed in a chamber having a temperature in a range of between, for example, approximately 50 degrees Celsius and approximately 425 degrees Celsius. In some embodiments, the second interconnect dielectric layer 124 is formed by way of a deposition process (e.g., PVD, CVD, PE-CVD, ALD, etc.). Further, in some embodiments, the second interconnect dielectric layer 124 may comprise an upper portion 124U arranged over a lower portion 124L and separated from the lower portion 124L by a third etch stop layer 1106. In such embodiments, the third etch stop layer 1106 may be formed by way of a deposition process (e.g., PVD, CVD, PE-CVD, ALD, etc.) and may comprise, for example, silicon nitride, silicon carbide, or some other suitable dielectric material. In other embodiments, the third etch stop layer 1106 may be omitted.

In some embodiments, the second masking structure 1102 may be formed using photolithography and removal (e.g., etching) processes. In some embodiments, the second masking structure 1102 comprises a photoresist material or a hard mask material. In some embodiments, the second masking structure 1102 comprises a first opening 1104 arranged directly over one of the interconnect wires 112.

In some embodiments, a first line 204 intersects a center of the interconnect wire 112 that directly underlies the first opening 1104. In some embodiments, a second line 302 intersects a center of the first opening 1104 of the second masking structure 1102. In such embodiments, the center of the interconnect wire 112 may be defined as a midpoint of a width of the interconnect wire 112 that directly underlies the first opening 1104. Similarly, in such embodiments, the center of the first opening 1104 may be defined as a midpoint of a width of the first opening 1104. In some embodiments, the first and second lines 204, 302 are perpendicular to an upper surface of the substrate 102. In some embodiments, due to photolithography precision and/or accuracy limitations, for example, the first line 204 may be offset from the second line 302. In such embodiments, the first opening 1104 may directly underlie a portion of the first interconnect dielectric layer 114, the first etch stop layer 120, and/or one of the air spacer structures 118. In such embodiments, the first opening 1104 may be misaligned with the underlying interconnect wire 112. In some other embodiments, the first line 204 may be collinear with the second line 302, and the first opening 1104 may only directly overlie an underlying interconnect wire 112. In yet other embodiments, the first line 204 may be collinear with the second line 302, but a width of the first opening 1104 may be greater than a width of the interconnect wire 112. In such other embodiments, although the first opening 1104 may be aligned with the underlying interconnect wire 112, the first opening 1104 may still directly overlie portions of the first interconnect dielectric layer 114, the first etch stop layer 120, and/or the air spacer structures 118.

Figure 12:
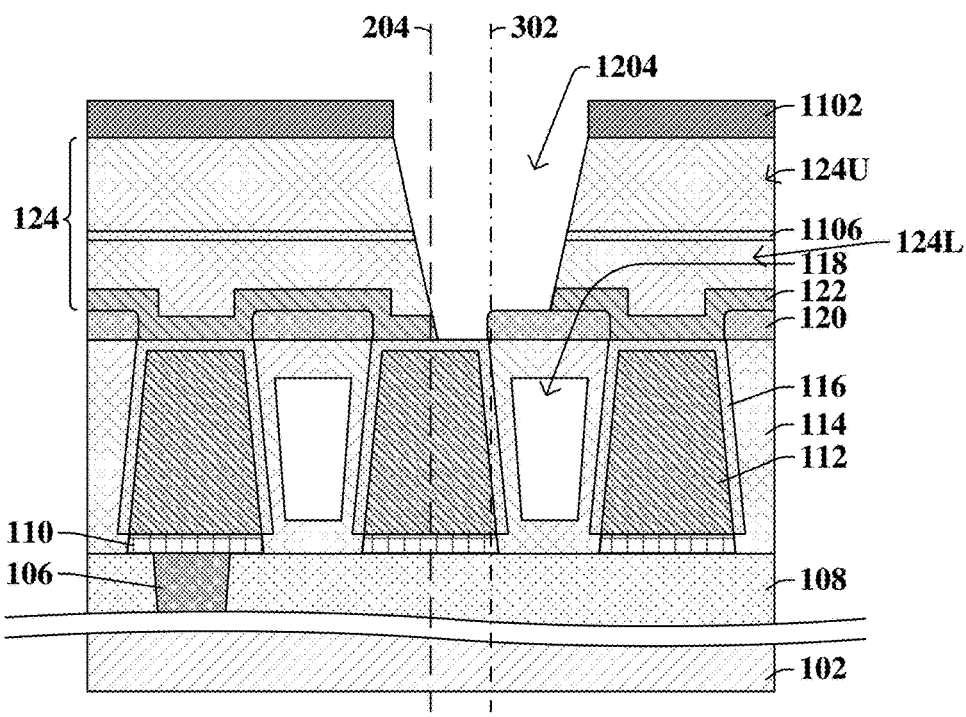

As shown in cross-sectional view 1200 of FIG. 12, in some embodiments, a removal process is performed to remove portions of the second interconnect dielectric layer 124, the third etch stop layer 1106, and the second etch stop layer 122 to form a first cavity 1204 in the second interconnect dielectric layer 124 according to the first opening (1104 of FIG. 11) of the second masking structure 1102. In some embodiments, the removal process is an etching process that comprises one or more etchants. In such embodiments, the protection liner 116 and the first etch stop layer 120 comprise materials that are substantially resistant to removal by the one or more etchants of the removal process of FIG. 12.

Thus, the first etch stop layer 120 may protect the first interconnect dielectric layer 114 from being removed by the removal process of FIG. 12, thereby preserving the isolation properties and/or features (e.g., air spacer structures 118). Further, the protection liner 116 may protect the interconnect wire 112 from damage and may also aid in protecting the first interconnect dielectric layer 114. Thus, because of the protection liner 116 and the first etch stop layer 120, the first cavity 1204 does not extend into and/or below an upper surface of the first interconnect dielectric layer 114 or the interconnect wires 112. Because the first etch stop layer 120 and the protection liner 116 prevent the first cavity 1204 from extending into the first interconnect dielectric layer 114, the first etch stop layer 120 and the protection liner 116 increase the processing window for an interconnect via (see, 126 of FIG. 16) to be formed within the first cavity 1204. The processing window for the interconnect via is increased because even if the first opening (1104 of FIG. 11) is misaligned with an underlying one of the interconnect wires 112, the first etch stop layer 120 and the protection liner 116 prevent any potential damage to the first interconnect dielectric layer 114.

Figure 13:
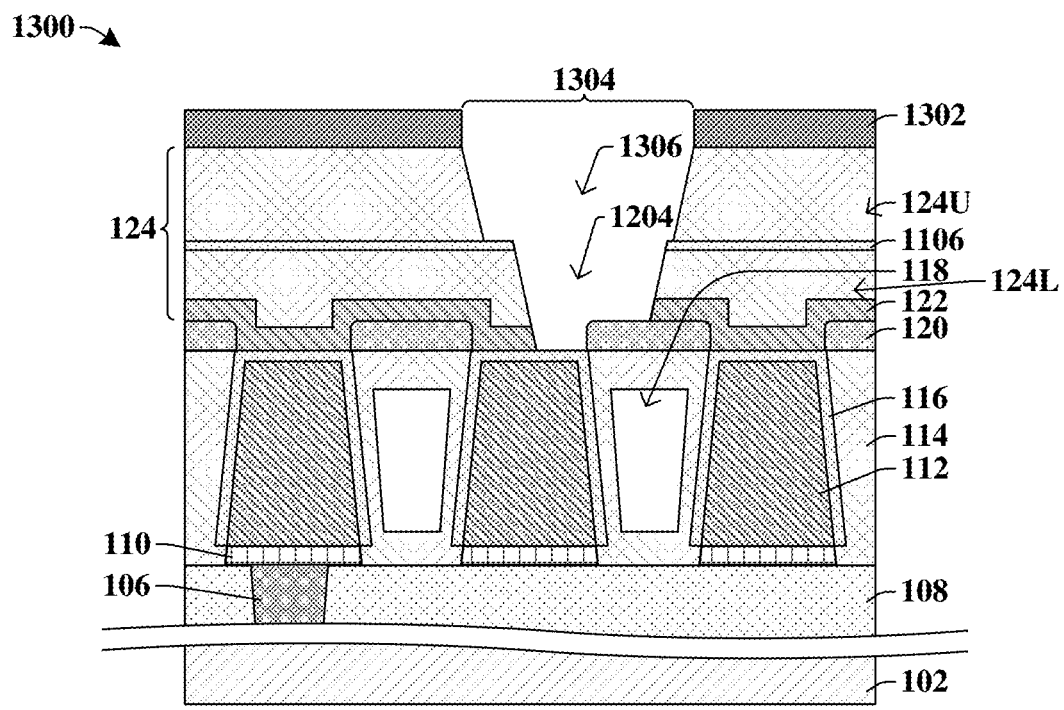

As shown in cross-sectional view 1300 of FIG. 13, in some embodiments, the second masking structure (1102 of FIG. 12) is removed, and a third masking structure 1302 comprising a second opening 1304 is formed over the second interconnect dielectric layer 124. The third masking structure 1302 may be formed using photolithography and removal (e.g., etching) processes. In some embodiments, the second opening 1304 may be arranged directly over the first cavity 1204. In some embodiments, the second opening 1304 may be wider than the first opening (1104 of FIG. 11) of the second masking structure (1102 of FIG. 12). In some embodiments, a removal process is performed according to the second opening 1304 of the third masking structure 1302 to form a second cavity 1306 arranged within the upper portion 124U of the second interconnect dielectric layer 124 and according to the third etch stop layer 1106. Thus, in some embodiments, the removal process of FIG. 13 is an etching process that comprises an etchant. In such embodiments, the third etch stop layer 1106 may be resistant to removal by the etchant of FIG. 13 to protect the first cavity 1204 arranged within the lower portion 124L of the second interconnect dielectric layer 124. In some embodiments, the formation of the first and second cavities 1204, 1306 in FIGS. 11-13 illustrates steps used in a dual damascene process to increase manufacturing efficiency of forming a wire over a via in a dielectric structure.

Figure 14A:
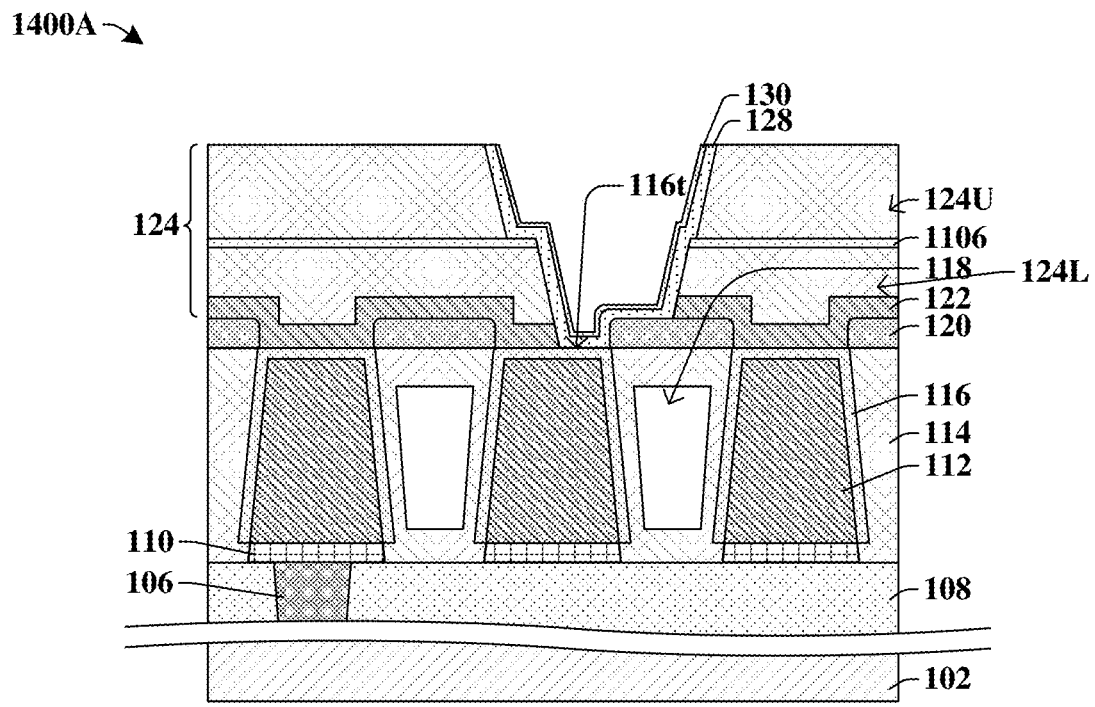

As shown in cross-sectional view 1400A of FIG. 14A, in some embodiments, the third masking structure (1302 of FIG. 13) is removed, and a third barrier layer 130 arranged over a second barrier layer 128 are formed to line the first and second cavities (1204, 1306 of FIG. 13) within the second interconnect dielectric layer 124. In some embodiments, the second and third barrier layers 128, 130 comprise, for example, tantalum nitride, titanium nitride, or some other suitable material. In some embodiments, the second and third barrier layers 128, 130 are formed through various steps of deposition processes (e.g., PVD, CVD, PE-CVD, ALD, sputtering, etc.), removal processes (e.g., wet etching, dry etching, chemical mechanical planarization (CMP), etc.). In some embodiments, the second barrier layer 128 may be formed directly on a topmost surface 116t of the protection liner 116 exposed by the first cavity (1204 of FIG. 13). In such embodiments, the second and third barrier layers 128, 130 are arranged directly over the topmost surface 116t of the protection liner 116 exposed by the first cavity (1204 of FIG. 13).

Figure 14B:
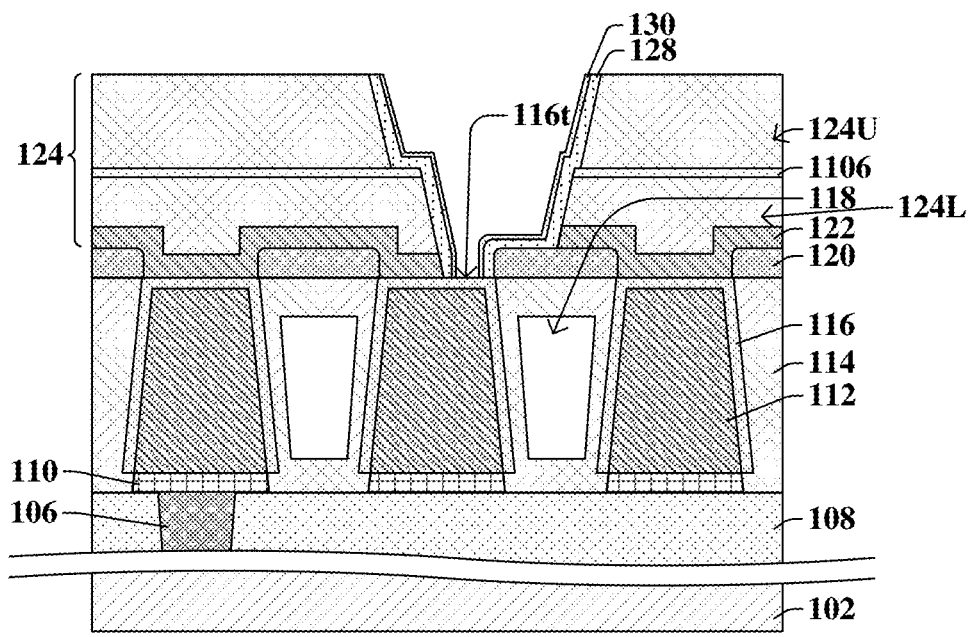

FIG. 14B illustrates a cross-sectional view 1400B of some alternative embodiments of the cross-sectional view 1400B of FIG. 14B. In some alternative embodiments, the second and/or third barrier layers 128, 130 comprise a metal-oxide or metal-nitride material that cannot be deposited on the protection liner 116 comprising graphene or some other suitable two dimensional material (e.g., hexagonal structures of boron nitride, molybdenum sulfide, tantalum sulfide, tungsten sulfide, tungsten sulfide, etc.). In such embodiments, the topmost surface 116t of the protection liner 116 exposed by the first cavity (1204 of FIG. 13) may remain exposed (e.g., uncovered).

In yet some other embodiments, the cross-sectional view 1400B of FIG. 14B may be a continuation of the cross-sectional view 1400A of FIG. 14A, wherein portions of the second and/or third barrier layers 128, 130 arranged on the topmost surface 116t of the protection liner 116 may be selectively removed. However, it will be appreciated that such selective removal of the second and/or third barrier layers 128, 130 may be difficult to achieve with such small dimensions (e.g., less than 20 nanometers).

Figure 15:
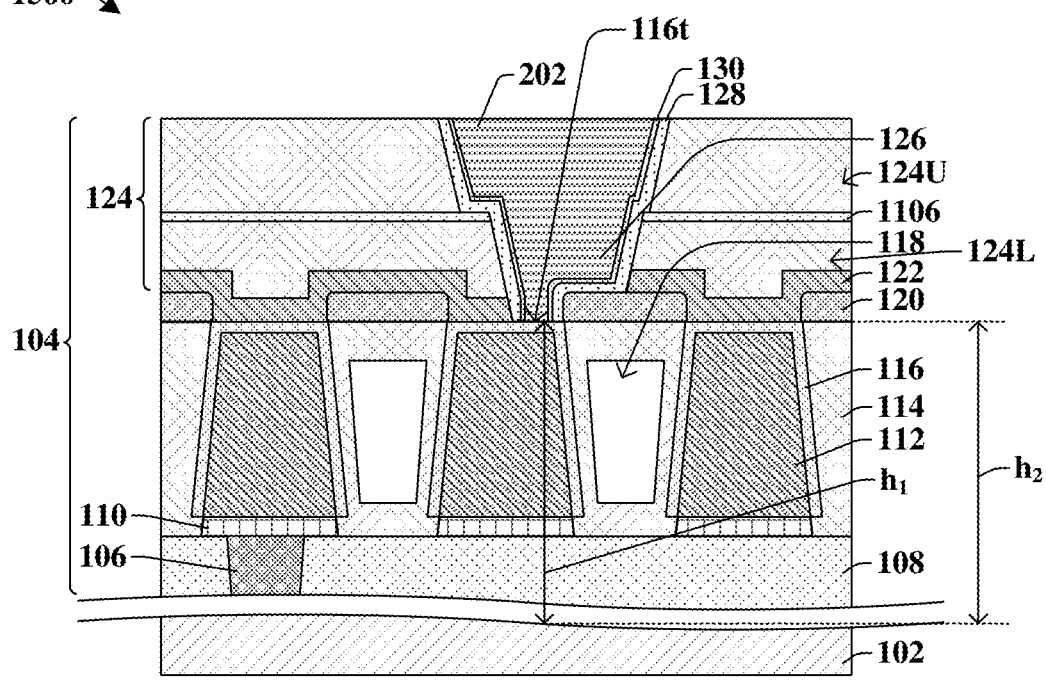

As shown in cross-sectional view 1500 of FIG. 15, in some embodiments, a conductive material is formed on the third barrier layer 130 to completely fill the first and second cavities (1204, 1306 of FIG. 13) in the second interconnect dielectric layer 124 to form an interconnect via 126 coupled to the underlying one of the interconnect wires 112 and to form an upper interconnect wire 202 arranged on the interconnect via 126. In some embodiments, the conductive material may be formed by way of deposition (e.g., PVD, CVD, PE-CVD, ALD, sputtering, etc.) and removal (e.g., CMP) processes. In some embodiments, the interconnect via 126 and the upper interconnect wire 202 may comprise, for example, copper, aluminum, tungsten, or some other suitable conductive material.

In some embodiments, the interconnect via 126 is arranged above the first interconnect dielectric layer 114 and the interconnect wires 112 and thus, is not arranged directly between adjacent ones of the interconnect wires 112. In other words, in such embodiments, the interconnect via 126 has a bottommost surface that is at a first height $h_1$ above the substrate 102, and the first interconnect dielectric layer 114 has a second height $h_2$ at a second height $h_2$ above the substrate. In such embodiments, the first height $h_1$ is greater than or equal to the second height $h_2$. The first and second heights $h_1$, $h_2$ may be measured in a direction perpendicular from a top surface of the substrate 102 and may be measured at a same location on the substrate 102.

In some embodiments, wherein the method proceeds from FIG. 14B to FIG. 15, the interconnect via 126 directly contacts the topmost surface 116t of the protection liner 116. In such embodiments, a contact resistance between the interconnect via 126 and the underlying one of the interconnect wires 112 is reduced. In other embodiments, wherein the method proceeds from FIG. 14A to FIG. 15, the second barrier layer 128 would directly contact the topmost surface 116t of the protection liner 116, thereby increasing contact resistance.

In some embodiments, the lower interconnect via 106, the interconnect wires 112, the interconnect via 126, and the upper interconnect wire 202 make up an interconnect structure 104 overlying the substrate 102 and providing conductive pathways between various electronic devices (e.g., semiconductor devices, photo devices, memory devices, etc.) arranged above and below the interconnect structure 104. As dimensions of integrated chips decrease, maintaining and/or improving isolation between adjacent conductive features is important. Further increasing the processing window for features of the integrated chip is advantageous due to manufacturing tool limitations. Thus, in some embodiments, the interconnect structures 104 may comprise a protection liner 116 comprising graphene to increase the processing window for the interconnect via 126 while also maintaining or improving isolation between adjacent interconnect wires 112 to provide a high-performance (e.g., high speeds) and reliable integrated chip.

Figure 16:
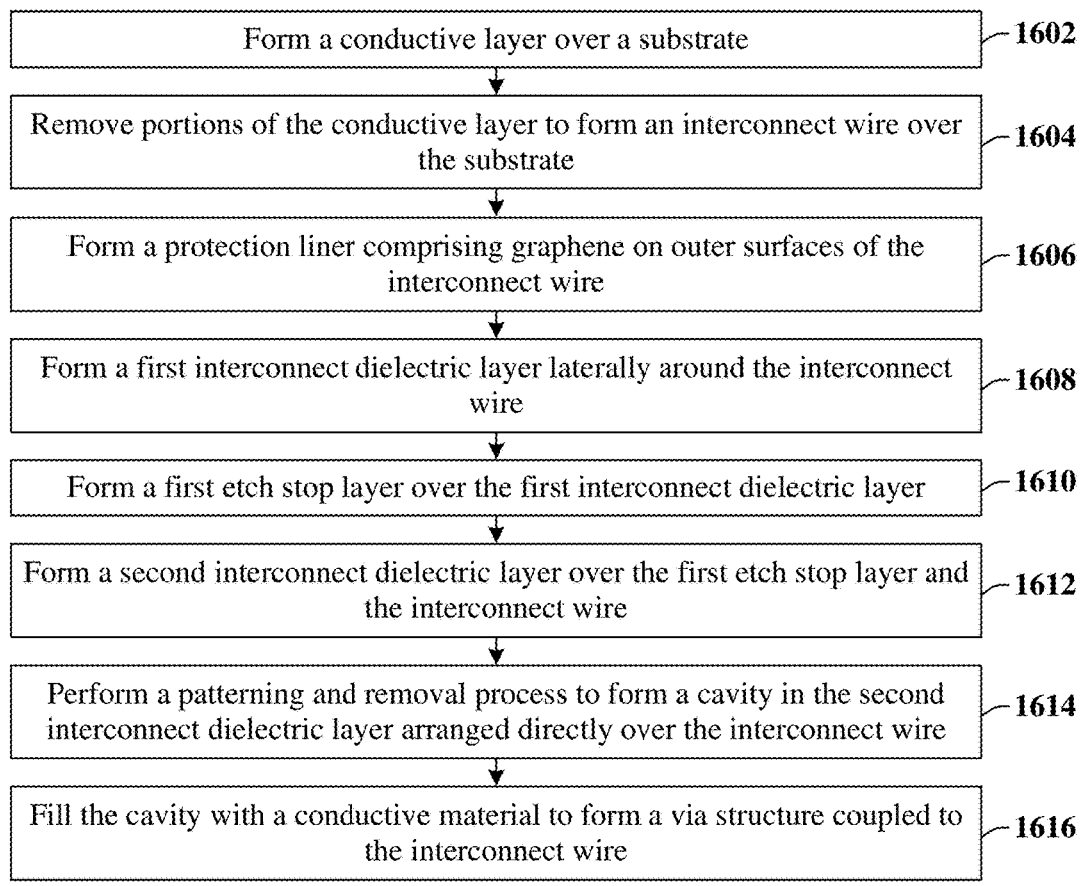
FIG. 16 illustrates a flow diagram of some embodiments corresponding to the method illustrated in FIGS. 5-15.

FIG. 16 illustrates a flow diagram of some embodiments of a method 1600 corresponding to the method illustrated in FIGS. 5-15.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a conductive layer is formed over a substrate. FIG. 5 illustrates a cross-sectional view 500 of some embodiments corresponding to act 1602.

At act 1604, portions of the conductive layer are removed to form an interconnect wire over the substrate. FIG. 6 illustrates a cross-sectional view 600 of some embodiments corresponding to act 1604.

At act 1606, a protection liner comprising graphene is formed on outer surfaces of the interconnect wire. FIG. 7 illustrates a cross-sectional view 700 of some embodiments corresponding to act 1606.

At act 1608, a first interconnect dielectric layer is formed laterally around the interconnect wire. FIG. 8 illustrates a cross-sectional view 800 of some embodiments corresponding to act 1608.

At act 1610, a first etch stop layer is formed over the first interconnect dielectric layer. FIG. 9 illustrates a cross-sectional view 900 of some embodiments corresponding to act 1610.

At act 1612, a second interconnect dielectric layer is formed over the first etch stop layer and the interconnect wire. FIG. 11 illustrates a cross-sectional view 1100 of some embodiments corresponding to act 1612.

At act 1614, a patterning and removal process is performed to form a cavity in the second interconnect dielectric layer arranged directly over the interconnect wire. FIGS. 12 and 13 illustrate cross-sectional views 1200 and 1300, respectively, of some embodiments corresponding to act 1614.

At act 1616, the cavity material is filled with a conductive material to form an interconnect via coupled to the interconnect wire. FIG. 16 illustrates a cross-sectional view 1500 of some embodiments corresponding to act 1616.

Therefore, the present disclosure relates to a method of forming an interconnect via over an interconnect wire, wherein a protection liner is formed on outer surfaces of the interconnect wire to aid in selective deposition and removal processes of various features when forming the interconnect via to increase the processing window for the interconnect via.

Accordingly, in some embodiments, the present disclosure relates to an integrated chip comprising: a lower interconnect dielectric layer arranged over a substrate; an interconnect wire arranged over the lower interconnect dielectric layer; a first interconnect dielectric layer arranged around outer sidewalls of the interconnect wire; a protection liner arranged directly on the outer sidewalls of the interconnect wire and on a top surface of the interconnect wire; a first etch stop layer arranged directly on upper surfaces of the first interconnect dielectric layer; a second interconnect dielectric layer arranged over the first interconnect dielectric layer and the interconnect wire; and a interconnect via extending through the second interconnect dielectric layer, arranged directly over the protection liner, and electrically coupled to the interconnect wire, wherein the protection liner comprises graphene.

In other embodiments, the present disclosure relates to an integrated chip comprising: an interconnect wire arranged over a substrate; a first interconnect dielectric layer laterally surrounding the interconnect wire; a protection liner arranged on an upper surface of the interconnect wire and separating the interconnect wire from the first interconnect dielectric layer; a first etch stop layer arranged over and directly contacting the first interconnect dielectric layer; a second etch stop layer arranged over and directly contacting the protection liner and the first etch stop layer; a second interconnect dielectric layer arranged over the second etch stop layer; and a interconnect via extending through the second interconnect dielectric layer and the second etch stop layer to electrically contact the interconnect wire.

In yet other embodiments, the present disclosure relates to a method comprising: forming a conductive layer over a substrate; removing portions of the conductive layer to form a interconnect wire over the substrate; forming a protection liner on outer surfaces of the interconnect wire; forming a first interconnect dielectric layer around the interconnect wire; forming a first etch stop layer selectively on the first interconnect dielectric layer and not on the protection liner; forming a second interconnect dielectric layer over the first etch stop layer and the protection liner; performing a patterning and removal process to form a cavity in the second interconnect dielectric layer arranged directly over the interconnect wire; and filling the cavity with a conductive material to form a interconnect via coupled to the interconnect wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a first line in a first wiring layer, the first line having a first line width defined between outer sidewalls of the first line in a cross-sectional view;
   a first via portion extending from the first line, the first via portion having a first via portion width defined between outer sidewalls of the first via portion in the cross-sectional view, the first via portion width being less than the first line width;
   a second feature in a second wiring layer that is adjacent to the first wiring layer; and
   a second via portion extending from the second feature and in electrical contact with the first via portion at an interface to form a via, the second via portion having a second via portion width defined between outer sidewalls of the second via portion in the cross-sectional view, the second via portion width being less than the first line width and being substantially equal to the first via portion width;
   wherein the first via portion tapers towards the interface from a first larger size to a second smaller size that is equal to the first via portion width; and
   wherein the second via portion tapers towards the interface from a third larger size to a fourth smaller size that is equal to the second via portion width.

2. The integrated chip of claim 1, further comprising:
   a dielectric layer laterally surrounding the second via portion; and
   a protection liner arranged directly on tapered outer sidewalls of the second via portion and on a top surface of the second via portion, and separating the dielectric layer from the second via portion.

3. The integrated chip of claim 2, further comprising:
   a first etch stop layer arranged directly on upper surfaces of the dielectric layer; and
   a second etch stop layer arranged directly on upper surfaces of the protection liner and the first etch stop layer.

4. The integrated chip of claim 2, wherein the protection liner comprises graphene.

5. The integrated chip of claim 2, further comprising:
air spacer structures embedded within the dielectric layer; and
wherein the second via portion is laterally between the air spacer structures.

6. An integrated chip comprising:
a substrate;
a first conductive feature disposed over the substrate;
a conductive interconnect feature arranged over the substrate, the conductive interconnect feature having a base feature portion with a base feature width and an upper feature portion with an upper feature width, wherein the upper feature width is narrower than the base feature width such that the conductive interconnect feature has tapered outer feature sidewalls;
an interconnect via arranged over the conductive interconnect feature, the interconnect via having a base via portion with a base via width and an upper via portion with an upper via width, wherein the upper via width is wider than the base via width such that the interconnect via has tapered outer via sidewalls, wherein the upper via width is substantially equal to the base feature width and the base via width is substantially equal to the upper feature width; and
a metal line disposed over the interconnect via, the metal line having a metal line width defined between outer sidewalls of the metal line, the metal line width being greater than each of the base feature width of the conductive interconnect feature, the upper feature width of the conductive interconnect feature, the base via width of the interconnect via, and the upper via width of the interconnect via.

7. The integrated chip of claim 6, further comprising:
a dielectric layer laterally surrounding the conductive interconnect feature; and
a protection liner arranged directly on the tapered outer feature sidewalls and on a top surface of the conductive interconnect feature, and separating the dielectric layer from the conductive interconnect feature.

8. The integrated chip of claim 7, further comprising:
air gaps embedded within the dielectric layer,
wherein the conductive interconnect feature is laterally between the air gaps, and
wherein the dielectric layer is arranged vertically between an air gap and the interconnect via.

9. The integrated chip of claim 7, wherein the interconnect via directly contacts the protection liner.

10. The integrated chip of claim 7, further comprising:
a first etch stop layer arranged directly on an upper surface of the dielectric layer.

11. The integrated chip of claim 10, wherein the first etch stop layer is not arranged directly on or directly over the top surface of the upper feature portion of the conductive interconnect feature.

12. The integrated chip of claim 10, further comprising:
a second etch stop layer arranged directly on the upper surface of the protection liner and directly on the upper surface of the first etch stop layer.

13. The integrated chip of claim 12, wherein the interconnect via extends through the second etch stop layer.

14. The integrated chip of claim 7, wherein the protection liner comprises graphene.

15. An integrated chip comprising:
a substrate;
a first conductive feature disposed over the substrate;
a first interconnect dielectric layer disposed over the first conductive feature;
an interconnect feature arranged in the first interconnect dielectric layer, the interconnect feature having a base portion with a base width and an upper portion with an upper width, wherein the upper width of the interconnect feature is less than the base width of the interconnect feature such that the interconnect feature has tapered outer sidewalls;
a second interconnect dielectric layer disposed over the interconnect feature;
a via disposed over and electrically coupled to the interconnect feature, the via having a base portion with a base width and an upper portion with an upper width, wherein the upper width of the via is greater than the base width of the via such that the via has tapered outer sidewalls, wherein the upper width of the via is substantially equal to the base width of the interconnect feature and the base width of the via is substantially equal to the upper width of the interconnect feature; and
a metal line disposed over the via, the metal line having a metal line width defined between outer sidewalls of the metal line, the metal line width being greater than each of the base width of the interconnect feature, the upper width of the interconnect feature, the base width of the via, and the upper width of the via.

16. The integrated chip of claim 15, wherein the via includes a protrusion that extends asymmetrically from the base portion of the via and that is coupled to the upper portion of the interconnect feature.

17. The integrated chip of claim 15, further comprising:
first and second air gaps disposed within the first interconnect dielectric layer and arranged on opposite sides of the interconnect feature.

18. The integrated chip of claim 17, wherein the first and second air gaps include lower portions and upper portions defined by inner sidewalls of the first interconnect dielectric layer, and wherein the upper portions of the first and second air gaps are wider than the lower portions of the first and second air gaps.

19. The integrated chip of claim 15, further comprising:
a protection liner arranged on the tapered outer sidewalls of the interconnect feature and on a top surface of the upper portion of the interconnect feature.

20. The integrated chip of claim 19, wherein the protection liner is arranged directly between the via and the interconnect feature.

* * * * *